(12) United States Patent
Daigo

(10) Patent No.: US 12,319,865 B2
(45) Date of Patent: Jun. 3, 2025

(54) THERMOSETTING RESIN COMPOSITION, CURED PRODUCT, AND PRINTED WIRING BOARD

(71) Applicant: TAIYO HOLDINGS CO., LTD., Hiki-gun (JP)

(72) Inventor: Yoshikazu Daigo, Hiki-gun (JP)

(73) Assignee: TAIYO HOLDINGS CO., LTD., Hiki-gun (JP)

( * ) Notice: Subject to any disclaimer, the term of this patent is extended or adjusted under 35 U.S.C. 154(b) by 0 days.

(21) Appl. No.: 18/587,698

(22) Filed: Feb. 26, 2024

(65) Prior Publication Data
US 2024/0287373 A1 Aug. 29, 2024

(30) Foreign Application Priority Data
Feb. 28, 2023 (JP) ................. 2023-030418

(51) Int. Cl.
C09K 5/14 (2006.01)
C08K 3/36 (2006.01)
C08K 7/18 (2006.01)
C08L 63/00 (2006.01)
H05K 1/03 (2006.01)

(52) U.S. Cl.
CPC ............... C09K 5/14 (2013.01); C08K 3/36 (2013.01); C08K 7/18 (2013.01); C08L 63/00 (2013.01); H05K 1/0373 (2013.01); C08K 2201/001 (2013.01); H05K 2201/0209 (2013.01)

(58) Field of Classification Search
CPC .................................................. B29K 2101/10
See application file for complete search history.

(56) References Cited

U.S. PATENT DOCUMENTS

2013/0337269 A1* 12/2013 Ohtsuka ............. C08G 59/4014
523/440
2014/0212582 A1* 7/2014 Padilla-Acevedo ... C08G 59/24
523/400
2022/0386453 A1* 12/2022 Matsutomi ............. H05K 3/421

FOREIGN PATENT DOCUMENTS

WO WO 2018/181737 A1 10/2018
WO WO 2020/105215 A1 5/2020
WO WO 2021/193376 A1 9/2021

OTHER PUBLICATIONS

Extended European Search Report issued Jul. 8, 2024 in European Patent Application No. 24159647.7, 7 pages.
Office Action issued Oct. 1, 2024, in corresponding Taiwan Patent Application No. 113101705, (with English-language Translation), 19 pages.

* cited by examiner

Primary Examiner — Ian A Rummel
(74) Attorney, Agent, or Firm — Oblon, McClelland, Maier & Neustadt, L.L.P.

(57) ABSTRACT

Provided is a thermosetting resin composition capable of achieving both thermal conductivity and dielectric breakdown resistance at high levels and forming a cured product with a surface having high smoothness. In a thermosetting resin composition, a thermosetting resin, a thermally conductive filler, a rheology modifier, and a wet dispersant are mixed to be solvent-free, and a thermal conductivity of a cured product of the thermosetting resin composition is adjusted to 2.5 W/m·K or more.

21 Claims, No Drawings

THERMOSETTING RESIN COMPOSITION, CURED PRODUCT, AND PRINTED WIRING BOARD

CROSS-REFERENCE TO RELATED APPLICATIONS

The present application claims the benefit of the filing date of Japanese Appl. No. 2023-030418, filed on Feb. 28, 2023.

BACKGROUND OF THE INVENTION

Field of the Invention

The present invention relates to a thermosetting resin composition, and particularly to a thermosetting resin composition suitably used for formation of a high thermal conductivity/high withstand voltage insulating layer. Further, the present invention also relates to a cured product of the thermosetting resin composition and a printed wiring board including the cured product.

Background Art

Conventionally, electrifying automobiles has progressed from the viewpoint of reducing the impact on the environment, and in recent years, demand for electric automobiles that run on electric motors (electric motors) has increased. Along with this, a semiconductor called a power semiconductor capable of conducting a large current at a high voltage is being increasingly used in electronic devices related to an electric motor of an automobile, for example, an inverter or a converter.

On the other hand, since such a power semiconductor conducts a large current at a high voltage, the own power semiconductor and a printed wiring board on which the power semiconductor is mounted are prone to be hot, and it is necessary to highly cool the printed wiring board for continuous and stable performance of an electronic device including such a printed wiring board. Conventionally, in order to cool a printed wiring board on which a power semiconductor is mounted, a structure is often adopted in which a temperature of the printed wiring board in close contact with a housing is lowered by cooling the housing that houses such a printed wiring board with water. In this case, it is necessary to cool the printed wiring board by efficiently transferring heat while preventing dielectric breakdown between the printed wiring board and the housing due to conducting of the power semiconductor at a high voltage. That is, in the printed wiring board, it is necessary to achieve both thermal conductivity and dielectric breakdown resistance (dielectric breakdown voltage) at high levels.

When an insulating layer of the printed wiring board is highly filled with a thermally conductive filler in order to improve the thermal conductivity of the printed wiring board, the dielectric breakdown resistance may decrease, and as a result, it is difficult to achieve both the thermal conductivity and the dielectric breakdown resistance at high levels. For example, Patent Document 1 proposes optimizing a particle diameter ratio of a thermally conductive filler to improve thermal conductivity while suppressing a decrease in dielectric breakdown resistance of a printed wiring board, but when an insulating layer of a printed wiring board is highly filled with an insulating filler having thermal conductivity, irregularities are prone to be formed on a surface of the insulating layer, contact between the printed wiring board and a housing is impaired, and as a result, cooling of the printed wiring board through the housing may not be sufficiently achieved. In addition, it has also been proposed to improve adhesion between the printed wiring board and the housing and to improve a cooling efficiency of the printed wiring board through the housing by further means such as applying a thermally conductive material to an irregular portion on the surface of the insulating layer to fill and smooth the irregular portion, but there are problems such as an increase in manufacturing cost of the printed wiring board and an increase in thermal resistance.

[Patent Document 1] WO2020/105215 A

SUMMARY OF THE INVENTION

Under such circumstances, it is a continuing technical problem to provide a thermosetting resin composition capable of achieving both thermal conductivity and dielectric breakdown resistance at high levels and forming a cured product with a surface having high smoothness.

Therefore, an object of the present invention is to provide a thermosetting resin composition capable of achieving both thermal conductivity and dielectric breakdown resistance at high levels and forming a cured product with a surface having high smoothness. Further, another object of the present invention is to provide a printed wiring board which achieves both thermal conductivity and dielectric breakdown resistance at high levels and includes a cured product with a surface having high smoothness.

As a result of intensive studies, the present inventors have found that the above problems can be solved in a manner that, in a thermosetting resin composition containing a thermosetting resin and a thermally conductive filler, a rheology modifier and a wet dispersant are further mixed to be solvent-free, and a thermal conductivity of a cured product of the thermosetting resin composition is adjusted to 2.5 W/m·K or more. The present invention is based on such findings. That is, the gist of the present invention is as follows.

[1] A thermosetting resin composition including: a thermosetting resin; a thermally conductive filler; a rheology modifier; and a wet dispersant, in which the thermosetting resin composition does not comprise a solvent, and a thermal conductivity of a cured product of the thermosetting resin composition is adjusted to 2.5 W/m·K or more.

[2] The thermosetting resin composition according to [1], in which a cured product of the thermosetting resin composition has a skin layer on a surface thereof.

[3] The thermosetting resin composition according to [1] or [2], in which the wet dispersant contains a phosphoric acid ester copolymer.

[4] The thermosetting resin composition according to any one of [1] to [3], in which a content of the wet dispersant is 2 to 14 parts by mass with respect to 100 parts by mass of the thermosetting resin.

[5] The thermosetting resin composition according to any one of [1] to [4], in which the rheology modifier contains at least one selected from the group consisting of fine powder silica and swellable layered mineral particles.

[6] The thermosetting resin composition according to any one of [1] to [5], in which the thermosetting resin is a liquid epoxy resin.

[7] The thermosetting resin composition according to any one of [1] to [6], in which the thermally conductive filler contains an aluminum oxide.

[8] The thermosetting resin composition according to any one of [1] to [7], in which a surface of a cured product of the thermosetting resin composition has an arithmetic average roughness Ra of 0.1 to 1.5 μm and a maximum height roughness Rz of 1.5 to 10 μm.

[9] A cured product of the thermosetting resin composition according to any one of [1] to [8].

[10] The cured product according to [9], in which the cured product has a skin layer on a surface thereof.

[11] The cured product according to [10], in which a thickness of the skin layer is 2 to 20 μm.

[12] A printed wiring board including the cured product according to any one of [9] to [11].

[13] A method for producing a printed wiring board including a cured product, the method including a step of curing the thermosetting resin composition according to any one of [1] to [8] to form the cured product.

According to the present invention, it is possible to provide a thermosetting resin composition capable of achieving both thermal conductivity and dielectric breakdown resistance at high levels and forming a cured product with a surface having high smoothness, a cured product, and a printed wiring board including the cured product.

DETAILED DESCRIPTION OF THE INVENTION

[Thermosetting Resin Composition]

According to one aspect of the present invention, there is provided a thermosetting resin composition (hereinafter, also referred to as "the thermosetting resin composition of the present invention"). The thermosetting resin composition of the present invention contains a thermosetting resin, a thermally conductive filler, a rheology modifier, and a wet dispersant, as essential components. The thermosetting resin composition of the present invention contains a thermosetting resin and a thermally conductive filler, further contains a rheology modifier and a wet dispersant, is solvent-free, and has a thermal conductivity of a cured product thereof adjusted to a predetermined range, thereby making it possible to achieve both thermal conductivity and dielectric breakdown resistance at a high level in a cured product of the thermosetting resin composition. In addition, the thermosetting resin composition of the present invention is subjected to screen printing and then step curing to form a skin layer to be described later in the vicinity of the surface of the cured product, and as a result, the surface of the cured product has high smoothness.

Since the cured product (hereinafter, also referred to as the "cured product of the present invention") formed from the thermosetting resin composition of the present invention has high dielectric breakdown resistance, high insulation can be continuously exhibited even in a printed wiring board required to be conducted with a large current at a high voltage. Also, since the cured product of the present invention has high thermal conductivity, the cured product can be efficiently cooled by contact with a cooling environment (for example, a cooling device and a component such as a housing cooled by the cooling device) around the printed wiring board. Furthermore, the cured product of the present invention has a surface having high smoothness and can be in favorable contact with the cooling environment as described above, and thus can be cooled more efficiently. Therefore, the thermosetting resin composition of the present invention can be suitably used for forming an insulating layer in a printed wiring board required to be conducted with a large current at a high voltage.

In the thermosetting resin composition of the present invention, a thermal conductivity of a cured product thereof is 2.5 W/m·K or more, preferably 2.7 W/m·K or more, more preferably 3.0 W/m·K or more, and particularly preferably 3.2 W/m·K. When the thermal conductivity of the cured product is within the range described above, the printed wiring board including the cured product can be efficiently cooled.

The thermal conductivity of the cured product of the thermosetting resin composition can be measured as follows. First, a thermosetting resin composition is applied onto a rolled copper foil using a T-150B screen plate to have a dry film thickness of 100 μm, thereby printing a coating film. Next, the substrate on which the coating film is printed is allowed to stand horizontally and subjected to defoaming leveling at 23° C. for 10 minutes, then allowed to stand in a hot air circulating box drying furnace and subjected to pre-curing at 100° C. for 20 minutes, and then subjected to post-curing at 160° C. for 60 minutes to thermally cure the thermosetting resin composition, thereby forming a cured coating film. Next, a thermal diffusivity of the film-shaped cured product obtained by peeling the rolled copper foil is measured by a periodic heating method at a load of 5 kgf/cm$^3$ using FTC-1 manufactured by ULVAC-RIKO, Inc. In addition, a specific heat capacity of the cured product is measured using a differential scanning calorimeter (DSC) manufactured by PerkinElmer, Inc., at a temperature increase of 20° C./min, a gas of helium of 20 ml/min, and a sample amount of 15 mg. Also, a density of the cured product is measured at room temperature (25° C.) by a water substitution method. Based on the measured thermal diffusivity ($\alpha$), specific heat capacity (c), and density ($\rho$) of the cured product, a thermal conductivity ($\lambda$) of the cured product is calculated by the following formula.

$$\text{Thermal conductivity } (\lambda) = \text{Thermal diffusivity } (a) \times \text{Specific heat capacity } (c) \times \text{Density } (\rho)$$

Hereinafter, each component of the thermosetting resin composition of the present invention will be described in detail.

(Thermosetting Resin)

The thermosetting resin preferably contained in the thermosetting resin composition of the present invention can be used without particular limitation as long as it can be cured by heat, but an epoxy resin can be suitably used. The epoxy resin can be used without limitation as long as it has two or more epoxy groups in one molecule. Examples of the epoxy resin include a bisphenol A epoxy resin, a bisphenol F epoxy resin, a hydrogenated bisphenol A epoxy resin, a brominated bisphenol A epoxy resin, a bisphenol S epoxy resin, a phenol novolac epoxy resin, a cresol novolac epoxy resin, a novolac epoxy resin of bisphenol A, a biphenyl epoxy resin, a naphthol epoxy resin, a naphthalene epoxy resin, a dicyclopentadiene epoxy resin, a triphenylmethane epoxy resin, an alicyclic epoxy resin, an aliphatic chain epoxy resin, a phosphorus-containing epoxy resin, an anthracene epoxy resin, a norbornene epoxy resin, an adamantane epoxy resin, a fluorene epoxy resin, an aminophenol epoxy resin, an aminocresol epoxy resin, and an alkylphenol epoxy resin.

The epoxy resins described above may be used alone, or may be used in combinations of two or more kinds thereof.

In addition, the thermosetting resin composition of the present invention may contain an epoxy resin having a bisphenol skeleton. Examples of the epoxy resin having a bisphenol skeleton include a bisphenol A epoxy resin, a bisphenol F epoxy resin, a bisphenol E (AD) epoxy resin, and a bisphenol S epoxy resin, and among these, a bisphenol A epoxy resin, a bisphenol F epoxy resin, and a bisphenol E (AD) epoxy resin are preferable. In addition, the epoxy resin having a bisphenol skeleton is used in any form of a liquid, a semi-solid, and a solid, and among these, the epoxy resin is preferably a liquid from the viewpoint of a filling property. The term "liquid form" refers to a liquid state having fluidity at 20° C.

These epoxy resins having a bisphenol skeleton may be used alone, or may be used in combinations of two or more kinds thereof, and it is preferable to use them in a combination of two or more epoxy resins selected from a bisphenol A epoxy resin, a bisphenol F epoxy resin, and a bisphenol E (AD) epoxy resin, from the viewpoint of having a better effect on characteristics after curing due to an excellent filling property. Examples of commercially available products thereof include ZX-1059 manufactured by NIPPON STEEL Chemical & Material Co., Ltd., jER (registered trademark) 828, jER (registered trademark) 834, jER (registered trademark) 1001 (bisphenol A epoxy resins), and jER 807 and jER 4004P (bisphenol F epoxy resins) which are manufactured by Mitsubishi Chemical Corporation, and R710 (bisphenol E epoxy resin) manufactured by Air Water Co., Ltd.

Also, the thermosetting resin composition of the present invention may contain a polyfunctional epoxy resin. Examples of commercially available products of the polyfunctional epoxy resin include EP-3300E and the like manufactured by ADEKA Corporation which are hydroxybenzophenone liquid epoxy resins, jER (registered trademark) 630 manufactured by Mitsubishi Chemical Corporation, ELM-100 and the like manufactured by Sumitomo Chemical Co., Ltd. which are aminophenol liquid epoxy resins (para-aminophenol liquid epoxy resins), jER (registered trademark) 604 manufactured by Mitsubishi Chemical Corporation, Epototo YH-434 manufactured by NIPPON STEEL Chemical & Material Co., Ltd., and SUMI-EPOXY (registered trademark) ELM-120 manufactured by Sumitomo Chemical Co., Ltd. which are glycidylamine epoxy resins, DEN-431 manufactured by The Dow Chemical Company which is a phenol novolac epoxy resin, and CELLOXIDE 2021P manufactured by Daicel Corporation which is an alicyclic epoxy resin. These polyfunctional epoxy resins may be used alone, or may be used in combinations of two or more kinds thereof.

The content of the thermosetting resin in the thermosetting resin composition is not particularly limited as long as the effect of the present invention is exhibited, and can be, for example, preferably 5% to 20% by mass, more preferably 10% to 20% by mass with respect to a total mass of the thermosetting resin composition.

(Curing Agent)

The thermosetting resin composition of the present invention may contain a curing agent for curing the thermosetting resin. As the curing agent, a known curing agent commonly used for curing a thermosetting resin can be used. Specific examples of the curing agent include imidazole latent curing agents such as amines, imidazoles, polyfunctional phenols, acid anhydrides, isocyanates, and imidazole adducts, and polymers containing these functional groups. Examples of the amines include dicyandiamide and diaminodiphenylmethane. Examples of the imidazoles include alkyl-substituted imidazoles and benzimidazoles. Examples of the polyfunctional phenols include hydroquinone, resorcinol, bisphenol A and halogen compounds thereof, and further include novolac and resol resins which are condensates thereof with aldehydes. Examples of the acid anhydride include phthalic anhydride, hexahydrophthalic anhydride, methylnadic anhydride, and benzophenonetetracarboxylic acid. Examples of the isocyanates include tolylene diisocyanate and isophorone diisocyanate. As the isocyanates, those obtained by masking these various isocyanates with phenols or the like can also be used. The curing agents may be used alone, or may be used in combination of two or more kinds thereof.

Among the curing agents described above, amines and imidazoles can be suitably used from the viewpoint of adhesion to a conductive portion and an insulating portion, storage stability, and heat resistance. Specifically, curing agents including, as a main component, an adduct compound of an aliphatic polyamine such as an alkylenediamine having 2 to 6 carbon atoms, a polyalkylene polyamine having 2 to 6 carbon atoms, or an aromatic ring-containing aliphatic polyamine having 8 to 15 carbon atoms, an adduct compound of an alicyclic polyamine such as isophoronediamine or 1,3-bis(aminomethyl)cyclohexane, or a mixture of the adduct compound of the aliphatic polyamine described above and the adduct compound of the alicyclic polyamine described above can be suitably used. In particular, a curing agent including, as a main component, an adduct compound of xylylenediamine or isophoronediamine is preferable.

As the adduct compound of the aliphatic polyamine, those obtained by addition reaction of aryl glycidyl ether (in particular, phenyl glycidyl ether or tolyl glycidyl ether) or alkyl glycidyl ether with the aliphatic polyamine are preferable. In addition, as the adduct compound of the alicyclic polyamine, those obtained by addition reaction of n-butyl glycidyl ether, bisphenol A diglycidyl ether, or the like with the alicyclic polyamine are preferable.

Examples of the aliphatic polyamine include alkylenediamines having 2 to 6 carbon atoms such as ethylenediamine and propylenediamine, polyalkylene polyamines having 2 to 6 carbon atoms such as diethylenetriamine and triethylenetriamine, and aromatic ring-containing aliphatic polyamines having 8 to 15 carbon atoms such as xylylenediamine.

Examples of the alicyclic polyamine include isophoronediamine, 1,3-bis(aminomethyl)cyclohexane, bis(4-aminocyclohexyl)methane, norbornenediamine, 1,2-diaminocyclohexane, and laromin.

Examples of the imidazoles include a reaction product of an epoxy resin and imidazole. Specific examples of the imidazoles include 2-methylimidazole, 4-methyl-2-ethylimidazole, 2-phenylimidazole, 4-methyl-2-phenylimidazole, 1-benzyl-2-methylimidazole, 2-ethylimidazole, 2-isopropylimidazole, 1-cyanoethyl-2-methylimidazole, 1-cyanoethyl-2-ethyl-4-methylimidazole, and 1-cyanoethyl-2-undecylimidazole.

Among the curing agents described above, from the viewpoint of maintaining the storage stability of the thermosetting resin composition, at least two or more of the curing agents described above may be contained, and one kind thereof may be an imidazole. In addition, from the viewpoint of suppressing cracking and delamination, it is preferable to contain at least one of a polyamine and an indazole latent curing agent. When imidazoles are contained, two or more imidazoles are preferably contained.

When the thermosetting resin is contained, a content of the curing agent is preferably 1 to 35 parts by mass, and more preferably 4 to 30 parts by mass, with respect to 100 parts by mass of the thermosetting resin, from the viewpoint of storage stability, viscosity ratio R, and ease of adjusting the pencil hardness according to a pencil hardness test in accordance with JIS-K5600-5-4:1999 in a state of being heated at 100° C. for 160 minutes to a more appropriate range. When the imidazoles and other curing agents are used in combination, a content ratio of the imidazoles and other curing agents is preferably 1:99 to 99:1, and more preferably 10:90 to 90:10 on a mass basis.

(Thermally Conductive Filler)

The thermosetting resin composition of the present invention contains a thermally conductive filler. The thermally conductive filler can be used without particular limitation as long as it is a particle capable of conducting heat. When mixing a thermally conductive filler in the thermosetting resin composition, it can be expected that the thermal conductivity of the thermosetting resin composition is improved. The thermally conductive filler may be used alone, or may be used in combination of two or more kinds thereof. When the thermosetting resin composition contains the thermally conductive filler, the thermal conduction efficiency of the thermosetting resin composition can be improved, and the specific gravity can be adjusted.

The kind of the thermally conductive filler is not particularly limited as long as the effect of the present invention is exhibited, and examples thereof include aluminum oxide (alumina), aluminum nitride, boron nitride, silicon nitride, silicon carbide, magnesium oxide, zinc oxide, and diamond. As the thermally conductive filler, aluminum oxide is particularly preferably used. In particular, when using spherical aluminum oxide, an increase in viscosity of the thermosetting resin composition when highly filled with the spherical aluminum oxide can be suppressed. Preferred examples of commercially available products of aluminum oxide include Denka spherical alumina DAW-03, DAW-07, ASFP-20, and the like manufactured by Denka Company Limited.

The thermal conductivity of the thermally conductive filler is not particularly limited as long as the effect of the present invention is exhibited, and is preferably 30 W/m·K or more.

A particle diameter of the thermally conductive filler is not particularly limited as long as the effect of the present invention is exhibited, and an average particle diameter (d50) thereof is preferably 0.01 to 30 μm, and more preferably 0.01 to 20 μm. The average particle diameter (d50) of the thermally conductive filler refers to an average particle diameter including not only a particle diameter of primary particles but also a particle diameter of secondary particles (aggregates). When the average particle diameter (d50) is 0.01 μm or more, an excessive increase in viscosity of the thermosetting resin composition is suppressed, so that the thermosetting resin composition can have high dispersibility and can exhibit high coatability to an object to be coated. On the other hand, when the average particle diameter is 30 μm or less, a protrusion from a coating film is less likely to occur, and a sedimentation rate is sufficiently slow, so that high storage stability is exhibited. The average particle diameter (d50) of the thermally conductive filler can be measured by a laser diffraction method using Microtrac MT3300 EXII manufactured by Nikkiso Co., Ltd.

It is preferable to use the thermally conductive filler in combination of two or more kinds thereof having average particle diameters that have a particle size distribution providing a closest-packed structure when mixing in the thermosetting resin composition. In the thermosetting resin composition, when the thermally conductive filler has a close-packed structure, a filling rate is further increased, and the thermal conductivity and the storage stability can be further improved.

A content of the thermally conductive filler in the thermosetting resin composition is not particularly limited as long as the effect of the present invention is exhibited, and can be appropriately set according to a kind of the thermally conductive filler, various characteristics of a thermally conductive filler as described above, and is preferably 60% by volume or more with respect to a total volume of the thermosetting resin composition. When the content of the thermally conductive filler is 60% by volume or more with respect to a total volume of the thermosetting resin composition, a cured product can have sufficient thermal conductivity as a heat dissipation material.

(Rheology Modifier)

The thermosetting resin composition according to the present invention contains a rheology modifier. The kind of the rheology modifier is not particularly limited as long as the effect of the present invention is exhibited, and examples thereof include fine powder silica, synthetic or natural swellable layered mineral particles (for example, bentonite, hectorite, vermiculite, halocyte, and swellable mica), ultrafine oxide particles (for example, titania and zirconia), polyvinyl alcohol, polyvinyl pyrrolidone, polyacrylic acid or a salt thereof, polymethacrylic acid or a salt thereof, water-soluble cellulose derivatives, and cellulose nanofibers. Preferred examples of the rheology modifier include fine powder silica and synthetic or natural swellable layered mineral particles. Preferred examples of the fine powder silica include fine powder silica having a specific surface area of 100 m$^2$/g or more. Examples of such fine powder silica include AEROSIL (registered trademark) 200 manufactured by Nippon Aerosil Co., Ltd. Also, Preferred examples of commercially available products of the swellable layered mineral particle include ORBEN M (bentonite) manufactured by Shiraishi Kogyo Kaisha, Ltd. The rheology modifier may be used alone, or may be used in combination of two or more kinds thereof.

A content of the rheology modifier in the thermosetting resin composition is not particularly limited as long as the effect of the present invention is exhibited, and can be appropriately set according to the kind of the rheology modifier, the kind and content of the wet dispersant to be described later, a desired Ti value of the thermosetting resin composition, and the like, and can be, for example, 0.2% to 1.5% by mass with respect to a total mass of the thermosetting resin composition.

(Wet Dispersant)

The thermosetting resin composition according to the present invention contains a wet dispersant. The wet dispersant is mainly used for promoting high filling with the thermally conductive filler in the thermosetting resin composition. When the thermosetting resin composition contains the wet dispersant, the thermal resistance of a cured product of the thermosetting resin composition can be reduced, and the smoothness of a surface can be improved. The wet dispersant may be used alone, or may be used in combination of two or more kinds thereof.

As a kind of the wet dispersant, a phosphoric acid ester-based compound is preferably used, and a phosphoric acid ester copolymer is particularly preferably used. Preferred examples of commercially available products of the phosphoric acid ester copolymer include wet dispersants BYK-W9010, BYK-W9011, and BYK-W9012 manufactured by BYK Japan KK.

A content of the wet dispersant in the thermosetting resin composition is not particularly limited as long as the effect of the present invention is exhibited, and can be appropriately set according to the kind of the wet dispersant, the kind and content of the rheology modifier described above, the viscosity of the thermosetting resin composition, and the surface smoothness, and is, for example, preferably 2 to 14 parts by mass with respect to 100 parts by mass of the thermosetting resin.

(Solvent)

The thermosetting resin composition of the present invention does not contain a solvent. In a case where the thermosetting resin composition contains a solvent, the viscosity of the thermosetting resin composition can be reduced and the printability can be improved. However, when the thermosetting resin composition is thermally cured, if volatilization of the solvent in a deep part of a coating film is insufficient, bubbles are generated, which may cause a decrease in dielectric breakdown voltage. Therefore, the thermosetting resin composition of the present invention does not contain a solvent from the viewpoint of improving dielectric breakdown resistance.

(Other Components)

The thermosetting resin composition may further contain one or more components of a colorant, an adhesion promoter (adhesion imparting agent), a polymerization inhibitor, an antioxidant, and a rust inhibitor, as necessary. As these, those known in the field of electronic materials can be used.

[Cured Product]

The cured product of the present invention is obtained by curing the thermosetting resin composition of the present invention described above, and is a cured product that achieves both thermal conductivity and dielectric breakdown resistance at high levels and has a surface having a high smoothness. Since the cured product of the present invention has the characteristics as described above, it can be suitably used as an insulating layer in a printed wiring board that is required to be conducted with a large current at a high voltage.

A thickness of the cured product of the present invention is not particularly limited as long as the effect of the present invention is exhibited, and is, for example, 30 to 200 µm. In addition, the cured product of the present invention may or may not be homogeneous throughout. When the thickness of the cured product is in the range described above, the cured product can exhibit sufficient dielectric breakdown resistance and sufficient thermal conductivity.

The cured product of the present invention preferably has a skin layer in the vicinity of a surface thereof. When the cured product has the skin layer, the surface of the cured product has high smoothness. Here, the skin layer refers to a layer in which an arithmetic average roughness Ra of the surface of the cured product is less than 1.0 µm, and substantially not containing a thermally conductive filler having a particle diameter of 1 µm or more. The phrase "substantially not containing a thermally conductive filler having a particle diameter of 1 µm or more" preferably refers to completely not containing a thermally conductive filler having a particle diameter of 1 µm or more, but does not exclude that a thermally conductive filler having a particle diameter of 1 µm or more is contained on a condition that the arithmetic average roughness Ra of the surface of the cured product is less than 1.0 µm. The presence or absence of the skin layer in the cured product can be determined by observing a cross section of the cured product using an optical microscope or the like and measuring a particle diameter of the thermally conductive filler. A cured product having such a skin layer may have a smooth surface as a result. A thickness of the skin layer is not particularly limited as long as the effect of the present invention is exhibited, and can be, for example, 2 to 20 µm.

In the cured product of the present invention, the arithmetic average roughness Ra of a surface thereof is preferably 0.1 to 1.5 µm, and the maximum height roughness Rz is preferably 1.5 to 10 µm. When Ra and Rz of the surface of the cured product are each in the ranges described above, the cured product can be in surface contact with a heat sink, so that heat conduction is further improved, and a component can be efficiently cooled.

Ra and Rz of the cured product can be measured as follows. First, a thermosetting resin composition is applied onto a CZ-polished copper solid substrate using a T-150B screen plate to have a dry film thickness of 100 µm, thereby printing a coating film. Next, the substrate on which the coating film is printed is allowed to stand horizontally and subjected to defoaming leveling at 23° C. for 10 minutes, then allowed to stand in a hot air circulating box drying furnace and subjected to pre-curing at 100° C. for 20 minutes, and then subjected to post-curing at 160° C. for 60 minutes to thermally cure the thermosetting resin composition, thereby producing a test substrate. Next, Ra (arithmetic average roughness) and Rz (maximum height roughness) of the surface of the cured product on the obtained test substrate are measured by a method in accordance with JIS B0601:2013 using a surface roughness measurement device SE600 manufactured by Kosaka Laboratory Ltd.

[Printed Wiring Board]

According to another aspect of the present invention, there is provided a printed wiring board (hereinafter, also referred to as a "printed wiring board of the present invention") including the cured product of the present invention. In a method for producing a printed wiring board according to the present invention, for example, the thermosetting resin composition according to the present invention is applied onto a base material by a method such as a screen printing method, and then the thermosetting resin composition is thermally cured in a state where the base material is left horizontally to form a cured coating film. The thermosetting resin composition can be thermally cured, for example, by heating at a temperature of 130° C. to 200° C. for 30 to 180 minutes. In one preferred embodiment, the thermosetting resin composition is thermally cured by step curing including preliminary curing (pre-curing) and main curing (post-curing). Specifically, after applying the thermosetting resin composition, the thermosetting resin composition is heated at a temperature of 60° C. to 100° C. (pre-curing) to reduce an apparent viscosity and promote antifoaming leveling. Subsequently, heat curing is performed by heating at a temperature of 140° C. to 180° C. to form a cured coating film. The time of the pre-curing described above can be, for example, 10 to 60 minutes, and the time of the post-curing can be 30 to 120 minutes.

Examples of the base material can include printed wiring boards and flexible printed wiring boards in which circuits are formed beforehand with copper or the like, and copper-clad laminates of all grades (FR-4 and the like) which use materials such as copper-clad laminates for high-frequency circuits using paper phenol, paper epoxy, glass cloth epoxy, glass polyimide, glass cloth/nonwoven epoxy, glass cloth/paper epoxy, synthetic fiber epoxy, fluororesin/polyethylene/polyphenylene ether, polyphenylene oxide/cyanate, or the like, as well as metal substrates, polyimide films, polyethylene terephthalate films, polyethylene naphthalate (PEN) films, glass substrates, ceramic substrates, and wafer plates.

The thermal curing (step curing) performed after applying the thermosetting resin composition according to the present invention can be performed using a hot air circulating drying furnace, an IR furnace, a hot plate, a convection oven, or the like (a method of bringing hot air in a dryer into countercurrent contact using one provided with an air heating type heat source using steam and a method of blowing the hot air on a support using a nozzle).

Examples

Hereinafter, the present invention will be described in more detail with reference to Examples, but the present invention is not limited to these Examples. In Examples, the terms "part(s)" and "%" are both on a mass basis unless otherwise specified.

[Preparation of Thermosetting Resin Composition]

Respective components shown in the following Table 1 were mixed in amounts shown in Table 1, and were preliminarily stirred using a stirrer, and then kneaded using a three-roll mill to prepare respective thermosetting resin compositions of Examples 1 to 6 and Comparative Examples 1 to 4. Details of each component in Table 1 are as follows.

Thermosetting resin 1: ZX-1059 manufactured by NIPPON STEEL Chemical & Material Co., Ltd.
Thermosetting resin 2: jER (registered trademark) 630 manufactured by Mitsubishi Chemical Corporation
Thermosetting resin 3: jER (registered trademark) YED216D manufactured by Mitsubishi Chemical Corporation
Adhesion imparting agent: Silane coupling agent KBM-403 (Chemical name: 3-glycidoxypropyltrimethoxysilane) manufactured by Shin-Etsu Chemical Co., Ltd.
Antifoaming agent: Oil compound type antifoaming agent KS-66 manufactured by Shin-Etsu Chemical Co., Ltd.
Curing agent: Imidazole-based epoxy resin curing agent CUREZOL 2MZA-PW manufactured by Shikoku Chemicals Corporation
Rheology modifier: AEROSIL (registered trademark) 200 manufactured by Nippon Aerosil Co., Ltd.
Wet dispersant 1: Wet dispersant BYK-111 manufactured by BYK Japan KK
Wet dispersant 2: Wet dispersant BYK-W9010 manufactured by BYK Japan KK
Wet dispersant 3: Wet dispersant BYK-W9011 manufactured by BYK Japan KK
Wet dispersant 4: Wet dispersant BYK-W9012 manufactured by BYK Japan KK
Thermally conductive filler 1: Denka spherical alumina DAW-07 manufactured by Denka Company Limited
Thermally conductive filler 2: Denka spherical alumina DAW-03 manufactured by Denka Company Limited
Thermally conductive filler 3: Denka spherical alumina ASFP-20 manufactured by Denka Company Limited In the composition of Comparative Example 1, the components could not be stirred and mixed, and a thermosetting resin composition could not be obtained. It is considered that, in Comparative Example 1, since the wet dispersant was not mixed and the mixing amount of the thermally conductive filler was large, the thermosetting resin was not sufficiently wetted on a surface of the thermally conductive filler, and therefore stirring and mixing could not be performed.

TABLE 1

| Component | | Example 1 | Example 2 | Example 3 | Example 4 | Example 5 | Example 6 |
|---|---|---|---|---|---|---|---|
| Component | Thermosetting resin 1 | 120 | 0 | 120 | 120 | 120 | 120 |
| | Thermosetting resin 2 | 0 | 120 | 0 | 0 | 0 | 0 |
| | Thermosetting resin 3 | 15 | 15 | 15 | 15 | 15 | 15 |
| | Adhesion imparting agent | 1 | 1 | 1 | 1 | 1 | 1 |
| | Antifoaming agent | 1 | 1 | 1 | 1 | 1 | 1 |
| | Curing agent | 6 | 6 | 6 | 6 | 6 | 6 |
| | Rheology modifier | 12 | 12 | 12 | 12 | 12 | 12 |
| | Wet dispersant 1 | 0 | 0 | 0 | 0 | 0 | 0 |
| | Wet dispersant 2 | 10 | 10 | 0 | 0 | 3 | 15 |
| | Wet dispersant 3 | 0 | 0 | 10 | 0 | 0 | 0 |
| | Wet dispersant 4 | 0 | 0 | 0 | 10 | 0 | 0 |
| | Thermally conductive filler 1 | 560 | 560 | 560 | 560 | 560 | 560 |
| | Thermally conductive filler 2 | 280 | 280 | 280 | 280 | 280 | 280 |
| | Thermally conductive filler 3 | 140 | 140 | 140 | 140 | 140 | 140 |
| Total | | 1145 | 1145 | 1145 | 1145 | 1138 | 1150 |
| Thickness of skin layer (μm) | | 10 | 8 | 10 | 9 | 10 | 14 |
| Surface roughness Ra/Rz | | 0.2/3.5 | 0.2/2.6 | 0.2/4.2 | 0.3/4.8 | 0.3/4.9 | 0.2/1.9 |
| Surface smoothness | | ○ | ○ | ○ | ○ | ○ | ○ |
| Dielectric breakdown voltage (kV/0.1 mm) | | 7.1 | 6.7 | 6.3 | 6.3 | 5.8 | 7.0 |
| Dielectric breakdown resistance | | ○ | ○ | ○ | ○ | ○ | ○ |
| Thermal conductivity (W/m · K) | | 3.3 | 3.5 | 3.3 | 3.3 | 3.4 | 3.2 |
| Thermal conductivity | | ○ | ○ | ○ | ○ | ○ | ○ |

| | | Comparative Example 1 | Comparative Example 2 | Comparative Example 3 | Comparative Example 4 |
|---|---|---|---|---|---|
| Component | Thermosetting resin 1 | 120 | 120 | 110 | 120 |
| | Thermosetting resin 2 | 0 | 0 | 0 | 0 |
| | Thermosetting resin 3 | 15 | 15 | 15 | 15 |
| | Adhesion imparting agent | 1 | 1 | 1 | 1 |
| | Antifoaming agent | 1 | 1 | 1 | 1 |
| | Curing agent | 6 | 6 | 6 | 6 |

TABLE 1-continued

|  | | | | |
|---|---|---|---|---|
| Rheology modifier | 12 | 12 | 12 | 12 |
| Wet dispersant 1 | 0 | 0 | 0 | 10 |
| Wet dispersant 2 | 0 | 1 | 20 | 0 |
| Wet dispersant 3 | 0 | 0 | 0 | 0 |
| Wet dispersant 4 | 0 | 0 | 0 | 0 |
| Thermally conductive filler 1 | 560 | 560 | 560 | 560 |
| Thermally conductive filler 2 | 280 | 280 | 280 | 280 |
| Thermally conductive filler 3 | 140 | 140 | 140 | 140 |
| Total | 1135 | 1136 | 1145 | 1145 |
| Thickness of skin layer (μm) | Cannot be mixed | None | 20 | None |
| Surface roughness Ra/Rz |  | 3.8/8.5 | 0.3/2.2 | 4.2/16.6 |
| Surface smoothness |  | x | ○ | x |
| Dielectric breakdown voltage (kV/0.1 mm) |  | 2.4 | 6.9 | 2.3 |
| Dielectric breakdown resistance |  | x | ○ | x |
| Thermal conductivity (W/m · K) |  | 2.1 | 1.9 | 2.3 |
| Thermal conductivity |  | x | x | x |

[Measurement of Thickness of Skin Layer]

Each of the thermosetting resin compositions of Examples and Comparative Examples was applied onto a CZ-polished copper solid substrate using a T-150B screen plate so that a dry film thickness was 100 μm to print a coating film (first coating film). Next, the substrate on which the first coating film was printed was horizontally subjected to defoaming leveling at 23° C. for 10 minutes, then allowed to stand in a hot air circulating box drying furnace and subjected to pre-curing at 100° C. for 20 minutes, and then subjected to post-curing at 150° C. for 30 minutes to thermally cure each thermosetting resin composition. Next, after the substrate was allowed to stand in room temperature, each of the thermosetting resin compositions was applied onto the first coating film using a T-150B screen plate so that a dry film thickness was 100 μm to print a coating film (second coating film). Next, the substrate on which the second coating film was printed was horizontally subjected to defoaming leveling at 23° C. for 10 minutes, then allowed to stand in a hot air circulating box drying furnace and subjected to pre-curing at 100° C. for 20 minutes, and then subjected to post-curing at 160° C. for 60 minutes to thermally cure each of the thermosetting resin compositions, thereby producing each test substrate. Each test substrate was cut, a cross section thereof was polished, a layer (skin layer) of the first coating film visible in a contact portion between the first coating film and the second coating film was observed with a digital microscope VHX-7000 manufactured by KEYENCE CORPORATION, and a thickness of the layer was measured. Since the skin layer does not contain a thermally conductive filler having a particle diameter of 1 μm or more, the degree of coloring is low (thin), and the skin layer transmits ambient light at the time of observation, so that an end portion is hardly visible. Therefore, when the thickness of the skin layer is measured, two layers are formed as described above, the cross section of the coating film is observed, and the thickness of the skin layer of the first coating film present at the contact portion between the first coating film and the second coating film is measured. The thickness of the skin layer of the cured product of each thermosetting resin composition is shown in Table 1.

From the results shown in Table 1, it is found that all the thermosetting resin compositions of Examples 1 to 6 have a skin layer, and a thickness thereof is 8 to 14 μm.

[Evaluation of Surface Smoothness of Cured Product]

Each of the thermosetting resin compositions of Examples and Comparative Examples was applied onto a CZ-polished copper solid substrate using a T-150B screen plate so that a dry film thickness was 100 μm to print a coating film. Next, the substrate on which the coating film was printed was allowed to stand horizontally and subjected to defoaming leveling at 23° C. for 10 minutes, then allowed to stand in a hot air circulating box drying furnace and subjected to pre-curing at 100° C. for 20 minutes, and then subjected to post-curing at 160° C. for 60 minutes to thermally cure each of the thermosetting resin compositions, thereby producing each test substrate. Next, Ra (arithmetic average roughness) and Rz (maximum height roughness) of a surface of a cured product on each test substrate obtained were measured by a method in accordance with JIS B0601:2013 using a surface roughness measurement device SE600 manufactured by Kosaka Laboratory Ltd., and the surface smoothness of the cured product of each thermosetting resin composition was evaluated according to the following criteria. The evaluation results are shown in Table 1.

The surface smoothness was evaluated according to the following criteria.

○: Ra is less than 1.0 μm, Rz is less than 5 μm, and surface smoothness is excellent.

x: Ra is 1.0 μm or more, Rz is 5 μm or more, and surface smoothness is insufficient.

From the results shown in Table 1, it is found that all the cured products formed from the thermosetting resin compositions of Examples 1 to 6 have excellent surface smoothness. It is found that the cured coating film having excellent surface smoothness has a skin layer, and protrusions of the thermally conductive filler are covered with the skin layer. On the other hand, it is found that the cured products formed from the thermosetting resin compositions of Comparative Examples 2 and 4 have insufficient surface smoothness. It is considered that in Comparative Example 2, sufficient surface smoothness was not obtained because there is little wet dispersant and the skin layer could not be formed. Also, it is considered that in Comparative Example 4, although a phosphoric acid ester-based copolymer was used as a wet dispersant, sufficient surface smoothness was not obtained because the effect of forming a skin layer was not exhibited.

[Evaluation of Thermal Conductivity of Cured Product of Thermosetting Resin Composition]

Each of the thermosetting resin compositions of Examples and Comparative Examples was applied onto a rolled copper foil using a T-150B screen plate so that a dry film thickness was 100 μm to print a coating film. Next, the substrate on which the coating film was printed was allowed to stand horizontally and subjected to defoaming leveling at 23° C. for 10 minutes, then allowed to stand in a hot air circulating box drying furnace and subjected to pre-curing at 100° C. for 20 minutes, and then subjected to post-curing at 160° C. for 60 minutes to thermally cure the each of thermosetting resin compositions, thereby forming a cured coating film. Next, a thermal diffusivity of the film-shaped cured product obtained by peeling the rolled copper foil was measured by a periodic heating method at a load of 5 kgf/cm$^3$ using FTC-1 manufactured by ULVAC-RIKO, Inc. In addition, a specific heat capacity of the cured product was measured using a differential scanning calorimeter (DSC) manufactured by PerkinElmer, Inc., at a temperature increase of 20° C./min, a gas of helium of 20 ml/min, and a sample amount of 15 mg. Also, a density of the cured product was measured at room temperature (25° C.) by a water substitution method. Based on the measured thermal diffusivity ($\alpha$), specific heat capacity (c), and density ($\rho$) of the cured product, a thermal conductivity ($\lambda$) of the cured product was calculated by the following formula.

Thermal conductivity ($\lambda$) =

Thermal diffusivity ($a$) × Specific heat capacity ($c$) × Density ($\rho$)

From the calculated thermal conductivity value, the thermal conductivity of the cured product of each thermosetting resin composition was evaluated according to the following criteria. The evaluation results are shown in Table 1.

○: The thermal conductivity is 2.5 W/m·K or more, and the thermal conductivity is excellent.

x: The thermal conductivity is less than 2.5 W/m·K, and the thermal conductivity is insufficient.

From the results shown in Table 1, it is found that all the cured products formed from the thermosetting resin compositions of Examples 1 to 6 have excellent thermal conductivity. Therefore, it can be said that a cured product formed from a thermosetting resin composition having a specific composition containing a thermosetting resin, a thermally conductive filler, a rheology modifier, and a wet dispersant can have excellent thermal conductivity.

[Evaluation of Dielectric Breakdown Resistance of Cured Product]

Each of the thermosetting resin compositions of Examples and Comparative Examples was applied onto a CZ-polished copper solid substrate using a T-150B screen plate so that a dry film thickness was 70 μm to print a coating film. Next, the substrate on which the coating film was printed was allowed to stand horizontally and subjected to defoaming leveling at 23° C. for 10 minutes, then allowed to stand in a hot air circulating box drying furnace and subjected to pre-curing at 100° C. for 20 minutes, and then subjected to post-curing at 160° C. for 60 minutes to thermally cure each of the thermosetting resin compositions, thereby producing each test substrate. In each of the test substrates obtained, a voltage value (dielectric breakdown voltage) at the time of dielectric breakdown of the cured product of the thermosetting resin composition on each of the test substrates was measured by increasing the voltage at 0.5 kV/see in an AC mode with an electrode having a diameter of 10 mm using a DC voltage resistance tester TOS5101 manufactured by KIKUSUI ELECTRONICS CO., LTD. The dielectric breakdown voltage was measured for each thermosetting resin composition on three test substrates, and a value of the second decimal place of an average value of the dielectric breakdown voltages of the three test substrates was rounded off to obtain a value up to the first decimal place. From the dielectric breakdown voltage thus obtained, the dielectric breakdown resistance of the cured product of each thermosetting resin composition was evaluated according to the following criteria. Respective evaluation results are shown in Table 1. Each value of the dielectric breakdown voltage (kV/0.1 mm) in Table 1 is obtained by converting the value of the dielectric breakdown voltage of each test substrate having a cured coating film having a thickness of 70 μm (0.07 mm) to 0.1 mm.

○: The dielectric breakdown voltage is 6 kV/0.1 mm or more, and the dielectric breakdown resistance is excellent.

x: The dielectric breakdown voltage is less than 6 kV/0.1 mm, and the dielectric breakdown resistance is insufficient.

From the results shown in Table 1, it is found that all the cured products formed from the thermosetting resin compositions of Examples 1 to 6 have excellent dielectric breakdown resistance. Therefore, it can be said that a cured product formed from a thermosetting resin composition having a specific composition containing a thermosetting resin, a thermally conductive filler, a rheology modifier, and a wet dispersant can have excellent dielectric breakdown resistance.

In addition, from the results shown in Table 1, it is considered that the cured products formed from the thermosetting resin compositions of Comparative Examples 2 and 4 had insufficient surface smoothness and were not sufficiently defoamed, so that the dielectric breakdown voltage or the thermal conductivity was not sufficiently obtained. In addition, it is considered that in Comparative Example 3, there was a lot of wet dispersant, the skin layer could be formed, but the thickness was too large, and the thermal conductivity was not sufficiently obtained.

The invention claimed is:

1. A thermosetting resin composition comprising:
   a thermosetting resin;
   a thermally conductive filler;
   a rheology modifier in a range of from 0.2 to 1.5% by mass, relative to a total thermosetting resin composition mass; and
   a wet dispersant in a range of from 2 to 14 parts by mass, relative to 100 parts by mass of the thermosetting resin,
   wherein the thermosetting resin composition does not comprise a solvent,
   wherein a thermal conductivity of a cured product of the thermosetting resin composition is adjusted to 2.5 W/m·K or more,
   wherein the thermosetting resin is a liquid epoxy resin,
   wherein the rheology modifier comprises fine powder silica having a specific surface area of 100 m$^2$/g or more, and
   wherein the wet dispersant comprises a phosphoric acid ester-based compound.

2. The composition of claim 1, wherein a cured product of the thermosetting resin composition has a skin layer on a surface thereof.

3. The composition of claim 1, wherein the phosphoric acid ester-based compound comprises a phosphoric acid ester copolymer.

4. The composition of claim 1, wherein the thermally conductive filler comprises an aluminum oxide.

5. The composition of claim 1, wherein a surface of a cured product of the thermosetting resin composition has an arithmetic average roughness Ra in a range of from 0.1 to 1.5 μm and a maximum height roughness Rz in a range of from 1.5 to 10 μm.

6. The composition of claim 1, wherein the rheology modifier further comprises the swellable layered mineral particles.

7. The composition of claim 1, wherein the thermally conductive filler has a d50 average particle diameter thereof in a range of from 0.01 to 30 μm.

8. The composition of claim 1, wherein the thermally conductive filler has a d50 average particle diameter thereof in a range of from 0.01 to 20 μm.

9. A cured product of the thermosetting resin composition of claim 1.

10. The cured product of claim 9, wherein the cured product has a skin layer on a surface thereof.

11. The cured product of claim 10, wherein the skin layer has a thickness in a range of from 2 to 20 μm.

12. A printed wiring board, comprising:
the cured product of claim 9.

13. A method for producing a printed wiring board including a cured product, the method comprising:
curing the thermosetting resin composition of claim 1, to form the cured product.

14. A thermosetting resin composition comprising:
a thermosetting resin;
a thermally conductive filler;
a rheology modifier in a range of from 0.2 to 1.5% by mass, relative to a total thermosetting resin composition mass; and
a wet dispersant in a range of from 2 to 14 parts by mass, relative to 100 parts by mass of the thermosetting resin,
wherein the thermosetting resin composition does not comprise a solvent,
wherein a thermal conductivity of a cured product of the thermosetting resin composition is adjusted to 2.5 W/m·K or more,
wherein the thermosetting resin is a liquid epoxy resin,
wherein the rheology modifier comprises bentonite, hectorite, and/or vermiculite, and
wherein the wet dispersant comprises a phosphoric acid ester-based compound.

15. The composition of claim 14, wherein the phosphoric acid ester-based compound comprises a phosphoric acid ester copolymer.

16. The composition of claim 14, wherein the thermally conductive filler comprises an aluminum oxide.

17. The composition of claim 14, wherein a surface of a cured product of the thermosetting resin composition has an arithmetic average roughness Ra in a range of from 0.1 to 1.5 μm and a maximum height roughness Rz in a range of from 1.5 to 10 μm.

18. The composition of claim 14, wherein a cured product of the thermosetting resin composition has a skin layer on a surface thereof.

19. A cured product of the thermosetting resin composition of claim 14.

20. The cured product of claim 19, wherein the cured product has a skin layer on a surface thereof.

21. The cured product of claim 20, wherein the skin layer has a thickness in a range of from 2 to 20 μm.

* * * * *